US008617962B2

(12) United States Patent
Schwarzenbach et al.

(10) Patent No.: US 8,617,962 B2
(45) Date of Patent: Dec. 31, 2013

(54) METHOD FOR FINISHING A SUBSTRATE OF THE SEMICONDUCTOR-ON-INSULATOR TYPE

(75) Inventors: Walter Schwarzenbach, Saint Nazaire les Eymes (FR); Aziz Alami-Idrissi, Le Touvet (FR); Alexandre Chibko, Saint Nazaire les Eymes (FR); Sebastien Kerdiles, Saint-Ismier (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 13/582,777

(22) PCT Filed: Mar. 14, 2011

(86) PCT No.: PCT/EP2011/053760
§ 371 (c)(1),
(2), (4) Date: Sep. 5, 2012

(87) PCT Pub. No.: WO2011/113775
PCT Pub. Date: Sep. 22, 2011

(65) Prior Publication Data
US 2013/0005122 A1    Jan. 3, 2013

(30) Foreign Application Priority Data
Mar. 18, 2010 (FR) ...................................... 10 51918

(51) Int. Cl.
*H01L 21/30* (2006.01)
(52) U.S. Cl.
USPC ........... 438/455; 438/458; 438/459; 438/479; 438/480; 257/506; 257/522; 257/E21.568

(58) Field of Classification Search
None
See application file for complete search history.

(56) References Cited

U.S. PATENT DOCUMENTS

| 5,233,218 | A | 8/1993 | Miura |
| 6,797,632 | B1 | 9/2004 | Nakano et al. |
| 6,939,783 | B2 | 9/2005 | Neyret et al. |
| 2007/0243694 | A1 | 10/2007 | Morita et al. |
| 2009/0170285 | A1 | 7/2009 | Soeta |
| 2011/0117691 | A1 | 5/2011 | Broekaart et al. |
| 2011/0233719 | A1* | 9/2011 | Blanchard ..................... 257/506 |

FOREIGN PATENT DOCUMENTS

FR    2935535 A1    3/2010

OTHER PUBLICATIONS

International Search Report for International Application No. PCT/EP2011/053760 dated Jul. 22, 2011, 3 pages.

* cited by examiner

Primary Examiner — Kyoung Lee
(74) Attorney, Agent, or Firm — TraskBritt

(57) ABSTRACT

The invention relates to finishing a substrate of the semiconductor-on-insulator (SeOI) type comprising an insulator layer buried between two semiconducting material layers. The method successively comprises routing the annular periphery of the substrate so as to obtain a routed substrate, and encapsulating the routed substrate so as to cover the routed side edge of the buried insulator layer by means of a semiconducting material.

20 Claims, 5 Drawing Sheets

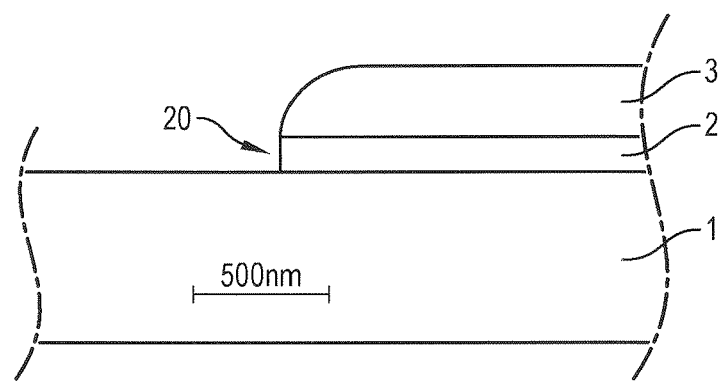
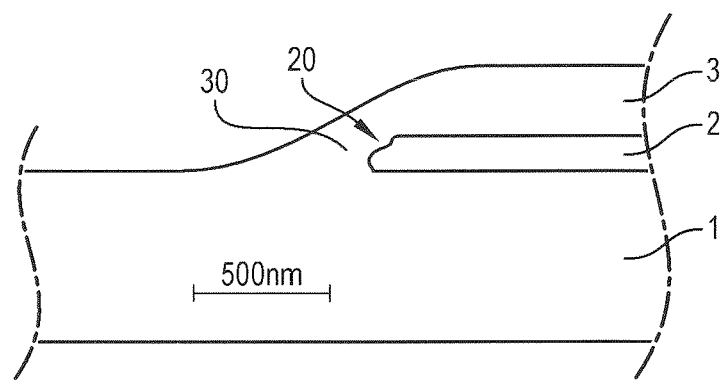

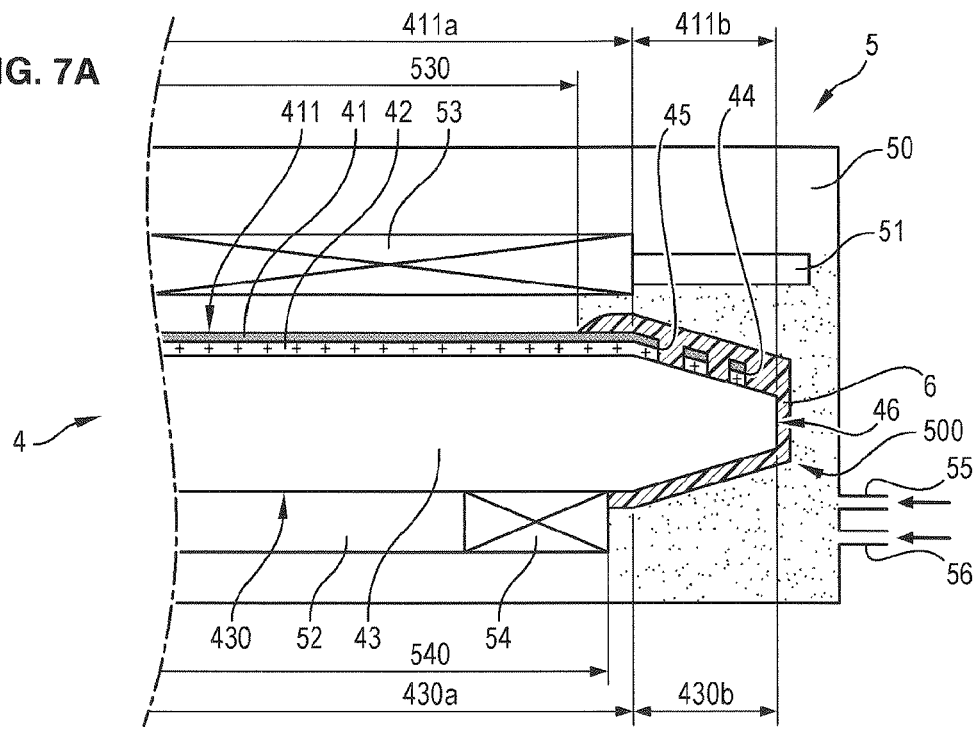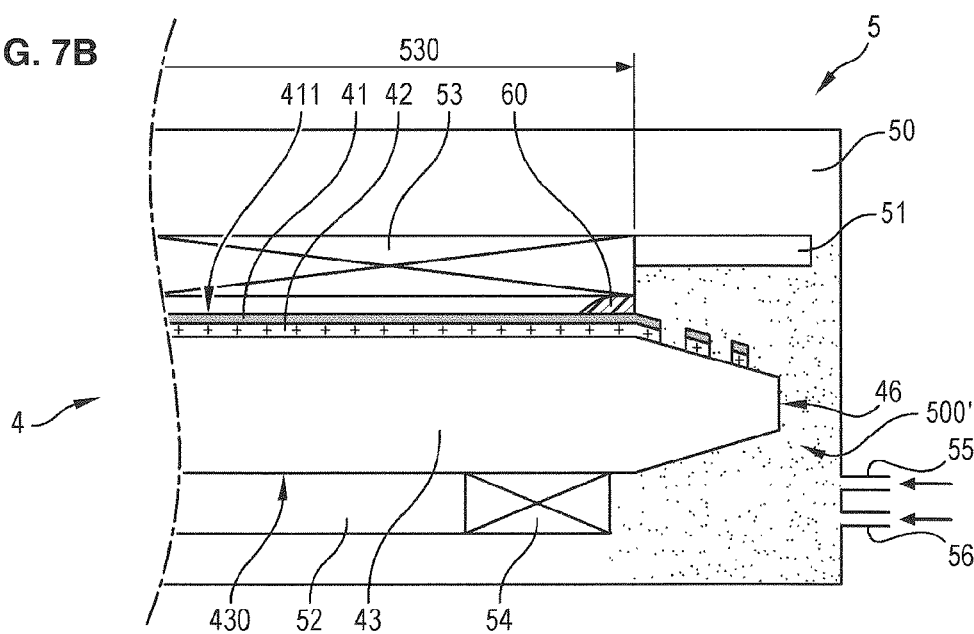

METHOD FOR FINISHING A SUBSTRATE OF THE SEMICONDUCTOR-ON-INSULATOR TYPE

CROSS-REFERENCE TO RELATED APPLICATIONS

This is a national phase entry under 35 U.S.C. §371 of International Patent Application PCT/EP2011/053760, filed Mar. 14, 2011, published in English as International Patent Publication WO 2011/113775 A1 on Sep. 22, 2011, which claims the benefit under Article 8 of the Patent Cooperation Treaty to French Patent Application Serial No. 1051918, filed Mar. 18, 2010, the disclosure of each of which is hereby incorporated herein by this reference in its entirety.

TECHNICAL FIELD

The invention generally relates to the manufacturing of substrates intended for applications in the fields of electronics, optics and optoelectronics. More specifically, it relates to a method for finishing a substrate known under the acronym of SeOI ("Semiconductor-On-Insulator"). The invention finds particular application in the finishing of an SOI ("Silicon-On-Insulator") substrate, wherein the semiconductor is silicon.

BACKGROUND

Among the different manufacturing methods used, mention may be made of those using steps for bonding and transferring layers. An example of such a method is described hereafter.

According to this method, an embrittlement area is generated within a first so-called "donor" substrate, covered with an insulating layer, for example, by implantation of atomic and/or ionic species. This substrate is then adhered by molecular adhesion to a second so-called "receiver" substrate.

Next, the donor substrate is separated into two portions, along this embrittlement area, for example, by detachment annealing ("exfoliation" or "splitting"), so that an intended thickness of the material of the donor substrate, as well as the insulator layer, are transferred onto the receiver substrate.

Reference may, for example, be made on this subject to the method known under the registered trade mark "UNI-BOND®" of the applicant.

The appended FIG. 1 is a graphic illustration of a photograph taken with a scanning electron microscope, which shows a cross-sectional view of the edge of an SOI substrate immediately after its detachment annealing. This SOI substrate comprises a buried insulator layer 2 between a silicon support 1 and a surface silicon layer 3. It is clearly seen that a side edge 20 of the insulator layer 2 (here silicon oxide) is potentially widely exposed to chemical etching.

Now, additional treatments are frequently carried out on such an SOI (or SeOI) substrate notably for improving its surface condition, in particular, for reducing its roughness or for strengthening the adhesive bond between two layers. Such treatments often involve chemical etching, for example, with hydrofluoric acid (HF).

Such a treatment applied to an SOI substrate, as the one illustrated in FIG. 1, results in delamination of the substrate by side etching of the insulator layer 2.

In order to overcome this problem, a method for treating an SOI substrate with Rapid Thermal Annealing (known as "RTA" to a person skilled in the art) is known from U.S. Pat. No. 6,939,783, this treatment having the effect of generating a side encapsulation of the edge of the silicon oxide layer 2 with the silicon located above.

The appended FIG. 2 is a graphic illustration of a photograph taken with a scanning electron microscope, which shows a transverse sectional view of the edge of an SOI substrate at the end of such a treatment. As this may be seen, the silicon of the surface layer 3 of the SOI is moved and covers the side edge 20 of the silicon oxide 2 by protecting the latter. This encapsulation portion is referenced as 30.

Now, the applicant carried out tests and unfortunately noticed that the expected protective beneficial effects of the encapsulation were not always obtained since the edge of the transferred silicon layer 3 may have irregularities relative to the ideal case illustrated in FIG. 2.

The applicant discovered that defects, present at the edge of an SeOI or SOI substrate and although being part of an exclusion area within which no electronic component will be produced, may perturb the encapsulation phenomenon.

Among the latter, a first type of defect designated as "flakes" is formed by pieces of the substrate that have appeared during detachment and that have been detached and then again notably adhesively bonded onto the edge of the substrate.

Such flakes 31 are visible in the appended FIG. 3, which schematically illustrates an SOI substrate seen as a transverse cross-sectional view.

A second type of defect called "jagged edge" is formed by extensions of the surface of the upper layer of silicon beyond the usual edge of the transferred surface.

Such defects 32 are visible in the aforementioned FIG. 3 and in the appended FIG. 4, which is a graphic illustration of a photograph of an SOI substrate edge as seen from above taken with a scanning electron microscope.

The applicant thus discovered that the obtained encapsulation, when it is achieved by an RTA treatment, may be perturbed, notably may be too thin at the top of the jagged edges 32. When this encapsulation is carried out by epitaxy treatment, it may also be perturbed, or even completely anarchical at the flakes 31 on which a larger amount of encapsulation material may be formed with, for example, the formation of material excrescences.

The encapsulation may not even be complete, depending on the shape of the irregularities present at the edge of the substrate (plate edge) and, consequently, certain portions of the buried insulator layer 2 may remain accessible to chemical etching, for example, with hydrofluoric acid (HF).

Moreover, certain flakes or jagged edge pieces may be detached from the receiver substrate before the encapsulation and be redeposited on the surface layer 3 of the SeOI substrate, and then be definitively sealed by the encapsulation, thereby generating defects the surface layer 3.

The appended FIG. 5 is an illustration of a photograph taken with a scanning electron microscope of a substrate of the SOI type, on which this poor quality encapsulation may be observed and, notably, the portion of the poorly encapsulated buried insulator that has undergone etching by hydrofluoric acid.

SUMMARY

The object of the invention is, therefore, to solve the aforementioned drawbacks of the state of the art.

The object of the invention is notably to provide a method for finishing a substrate of the SeOI type with which it is possible to have very good quality encapsulation of the side edge of the buried insulator layer, i.e., a homogeneous encapsulation, such that the side edge of the insulator layer is covered over its totality with a layer of semiconducting material with a relatively constant thickness and the edge of the layer of semiconducting material forms a regular crown at a constant distance from the edge of the plate.

For this purpose, the invention relates to a method for finishing a substrate of the semiconductor-on-insulator (SeOI) type comprising an insulator layer buried between two layers of semiconducting material.

According to the invention, the method successively comprises:
routing of the annular periphery of the substrate so as to obtain a routed substrate; and
encapsulation of the routed substrate so as to cover the routed side edge of the buried insulator layer, by means of a semiconducting material.

According to other advantageous and non-limiting features of the invention, taken alone or as a combination:
the encapsulation of the routed substrate is carried out immediately after routing;
the routing is carried out by grinding of the peripheral annular edge of the SeOI substrate;
the routing is carried out by etching of the peripheral annular edge of the SeOI substrate;
the encapsulation of the routed substrate is carried out by submitting it to a rapid thermal annealing (RTA) treatment;
the rapid thermal annealing (RTA) treatment is conducted at a temperature comprised between 1,150° C. and 1,300° C., for a duration comprised between 15 seconds and about 5 minutes;
the rapid thermal annealing (RTA) treatment is conducted under an atmosphere of hydrogen and/or argon;
the step for encapsulating the routed substrate is carried out by epitaxy;
the step for encapsulating the routed substrate is carried out by a rapid thermal annealing (RTA) treatment and by epitaxy;
the step for encapsulating the routed substrate is carried out by annealing with a laser;
the routing comprises the steps of:
depositing a layer of a protective material on a peripheral annular area of the SeOI substrate, by means of a plasma;
achieving partial etching of the protective material by means of a plasma, so as to keep a ring of protective material on the front face of the SeOI substrate, this ring extending at a distance from the side edge of the substrate, and to thereby delimit a reduced peripheral annular area of the substrate accessible to a plasma;
generating a partial etching plasma, localized at the reduced peripheral annular area of the SeOI substrate, so as to etch the material present in this area over a certain thickness;
removing the ring of protective material by means of a plasma.
Routing is carried out in an enclosure for forming an isotropic plasma.
The routing is carried out by steps consisting of:
introducing the SeOI substrate inside an enclosure for forming an isotropic plasma, equipped with an upper disk-shaped insulating element and with two electrodes, one of them a so-called "lower" electrode being surrounded by a lower insulating element with a circular contour, the substrate being positioned in the enclosure so that its rear face is in contact with the lower electrode and with the lower insulating element, so as to define an exclusion area on the rear face, inaccessible to the plasma, and the upper insulating element being positioned at a distance from the front face of the SeOI substrate, so as to define an exclusion area on the front face also inaccessible to the plasma, the outer diameters of both lower and upper insulating elements, being less than the diameter of the SeOI substrate to be routed, the remainder of this substrate forming the peripheral annular area accessible to the plasma;
depositing the layer of a protective material on the peripheral annular area, by means of a plasma formed in the enclosure;
bringing the upper insulator closer to the front face of the SeOI substrate and performing the partial etching of the protective material;
while maintaining the upper insulator in its position, etching a thickness of the material forming the SeOI substrate;
moving the upper insulator away from the front face of the substrate and removing the ring of protective material;
the routing and encapsulation steps are followed by a sacrificial oxidation step and then by a deoxidation step.
The sacrificial oxidation and deoxidation steps are followed by a rapid thermal annealing (RTA) treatment, and then, optionally, by a second sacrificial oxidation and by a second deoxidation, the latter, however, not being indispensable since the encapsulation is then achieved by the last rapid annealing (RTA) step.
The method comprises a first series of steps including a rapid thermal annealing (RTA) treatment followed by sacrificial oxidation and deoxidation and in that this first series of steps precedes the steps for routing and encapsulating the substrate.

Other features and advantages of the invention will become apparent from the description which will now be made, with reference to the appended drawings, which illustrate as an indication and not as a limitation, a possible embodiment thereof.

BRIEF DESCRIPTION OF THE DRAWINGS

FIG. 1 is an illustration of how a cross-section of an edge of an SOI substrate may appear when photographed with a scanning electron microscope.

FIG. 2 is similar to FIG. 1 and illustrates the edge of the SOI substrate after subjecting the SOI substrate to a Rapid Thermal Annealing treatment.

FIGS. 7A-7D are diagrams illustrating, as a cross-sectional view, a portion of the substrate to be routed and of an installation allowing application of routing, during the different progression stages of the routing, respectively.

DETAILED DESCRIPTION

In the diagrams of FIGS. 3, 6A-6C and 7A-7D, it will be noted that the respective proportions of the different illustrated layers or elements have not always been observed, certain areas having voluntarily been enlarged for explanatory purposes.

The method according to the invention is a so-called "finishing" method for a substrate of the semiconductor-on-insulator SeOI type, since it relates to steps carried out after the detachment annealing, which results in the transfer of layer(s) and in the formation of the SeOI type substrate comprising an insulator layer buried between two semiconducting material layers.

The method according to the invention will now be described with reference to FIGS. 6A-6C.

Figure 3:
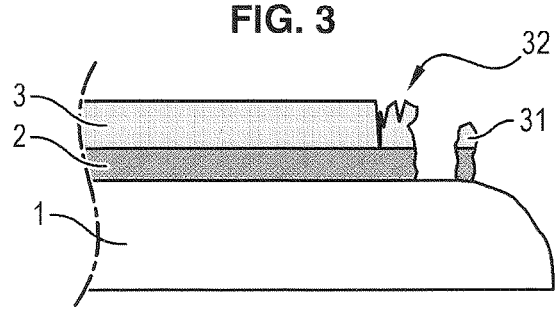
FIG. 3 is similar to FIGS. 1 and 2 and illustrates defects that may be formed in or on the SOI substrate upon subjecting the SOI substrate to such a Rapid Themial Annealing treatment.
Figure 4:
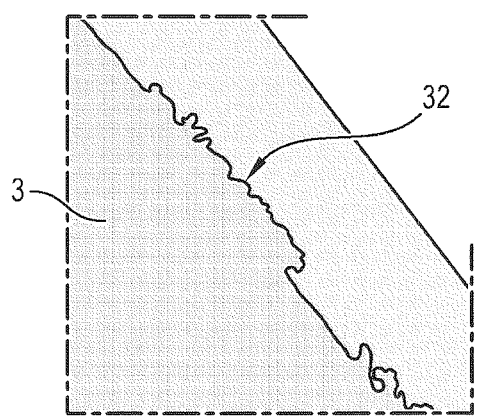
FIG. 4 is a plan view of a defective edge of an SOI substrate like that shown in FIG. 3.
Figure 5:
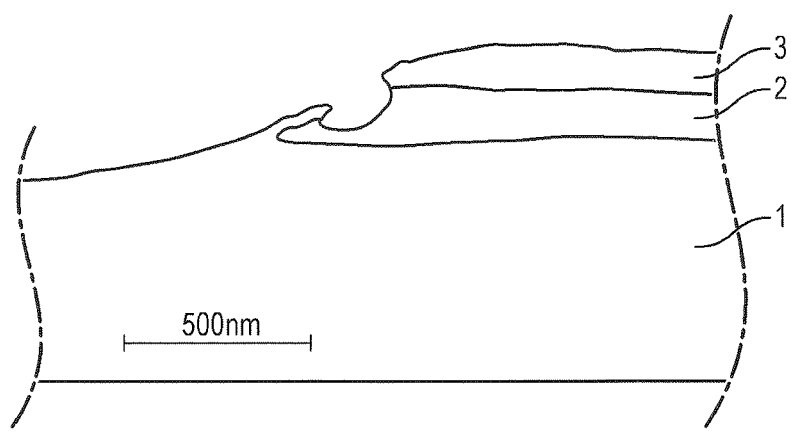
FIG. 5 is similar to FIGS. 1 through 3 and illustrates another defective edge of an SOI substrate that includes a poorly encapsulated buried insulator that has undergone etching by hydrofluoric acid.
Figure 6A:
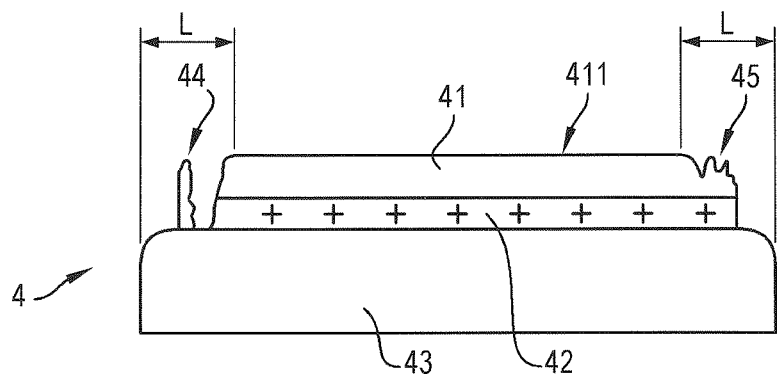
FIGS. 6A-6C are diagrams illustrating the different method steps according to the invention.

Referring to FIG. 6A, a substrate 4 of the SeOI type may be seen that successively comprises a surface layer 41 of semiconducting material, a buried insulator layer 42 and a support 43 also made in a semiconducting material.

As this may be seen in this figure, at the end of the step for transferring layer(s), the SeOI substrate 4 obtained has defects of the aforementioned type, i.e., flakes 44, only one of which is visible in this figure, and an annular peripheral jagged edge referenced as 45.

The first step of the method according to the invention consists of carrying out routing of the peripheral annular edge of the substrate 4. This step is illustrated in FIG. 6B.

Its application methods will be described hereafter. This routing step has the effect of removing over a certain width L of the edge of the surface layer 41 and the edge of the buried insulator layer 42. Preferably, this routing is conducted so as to route the substrate 4 at a constant and controlled distance from the physical edge of the substrate 4.

Optionally, the routing may also be conducted until a portion of the annular periphery of the support 43 is removed over a depth P.

L is a width typically varying from 0.5 mm to 3 mm. L is selected to be slightly greater than the width of the crown present on the SeOI substrate so as to remove by routing the defects of the flake or jagged edge type and to obtain a crown of constant width after routing.

P varies from 0 to a few thousands of angstroms, typically 500 Å to 1,000 Å (50 nm to 100 nm).

Figure 6B:
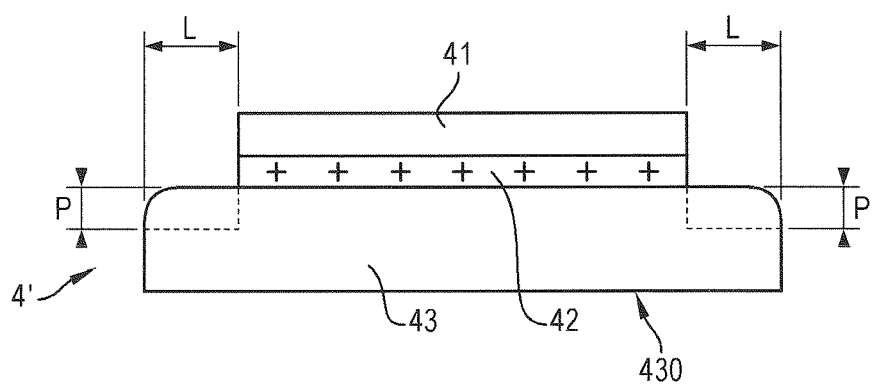

In FIG. 6B, the supporting substrate 43 has not been illustrated as routed.

The routed substrate is referenced as 4'.

Figure 6C:
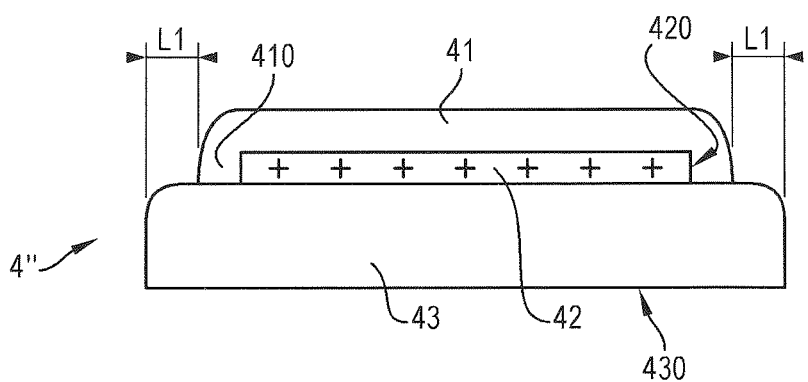

The following step, illustrated in FIG. 6C, consists of achieving encapsulation of the routed lateral edge 420 of the buried insulator 42. This step has the effect of causing flow of the semiconducting material forming the surface layer 41 facing this edge 420, which has the effect of protecting it and of making it inaccessible to subsequent chemical etchings, while thereby avoiding delamination phenomena.

The portion of the material 41 encapsulating the insulator 42 is referenced as 410. The routed and encapsulated substrate is referenced as 4".

The methods for applying this encapsulation step will be described hereafter.

Preferably, the encapsulation step is carried out immediately after the routing one, so as to avoid any accidental contamination of the routed substrate 4' before the encapsulation and to at most limit the risk of alteration of the quality of the film edge obtained by routing. The encapsulation should be made before the edge loses its regularity. The film consisting of the surface layer 41 and of the buried insulator 42 is then only still slightly adhered to the receiving supporting substrate 43 and its edge notably should be reinforced in order to avoid tears or scratches.

According to an alternative embodiment, the encapsulation may also be carried out immediately after a cleaning step, itself carried out after routing.

Routing

The routing may be carried out by various techniques and notably by mechanical grinding or an etching step.

The grinding may, for example, be achieved by placing the substrate 4 on a support driven into rotation, by bringing into the proximity of its edge, a polishing shoe, optionally covered with an abrasive solution ("slurry") and by applying the latter on the edge of the substrate 4 over a width L to be routed.

Reference may be made on this subject to documents U.S. Pat. No. 6,797,632 and U.S. Patent Publication 2007/0243694, which describe routing by grinding and/or polishing.

The routing may also be carried out by wet or dry etching.

Wet etching consists of forming a protective mask on a central portion of the front face 411 of the surface layer 41, this mask being of a diameter of less than that of the layer 41, so as to leave an unprotected annular peripheral area. The substrate 4 is then successively exposed to specific etching solutions for the materials forming the surface layer 41 and the insulating layer 42, so as to etch and remove the unprotected edges of the substrate 4.

Dry etching consists of submitting the edge of the substrate 4 unprotected by a mask, to gas etching, for example, with an isotropic or anisotropic plasma.

Reference may, for example, be made to document U.S. Patent Publication 2009/0170285, which describes a dry etching method.

When it is desired to obtain a particularly clean routed edge, i.e., perpendicular or quasi perpendicular to the plane of the front face 411, it is possible to use the installation and the routing method, which will now be described in connection with FIGS. 7A-7D.

In these figures, the substrate 4 is chamfered, so that its front face 411 is broken down into a non-chamfered planar central area 411a and into a chamfered peripheral area 411b and so that also its rear face 430 is broken down into a non-chamfered planar area 430a and a chamfered area 430b.

The side edge of substrate 4 is referenced as 46.

The routing is carried out inside a reactor 5 for forming plasma, such as the one illustrated in FIGS. 7A-7D.

The reactor 5 comprises an enclosure 50, inside which are installed two insulating elements 53, 54 and two electrodes 51, 52, the latter being connected to an electric power supply not shown in the figures.

The substrate 4 to be routed rests on the lower electrode 52 and the lower insulating element 54, through its rear face 430.

The lower electrode 52 is surrounded by the lower insulating element 54 with a circular contour. Preferably, the electrode 52 is circular and the insulating element 54 is annular.

Moreover, the upper insulator 53 is disk-shaped and the electrode 51 that surrounds it is ring-shaped.

The upper insulating element 53 is mounted on driving means, not shown in the figures, that allow its displacement along a vertical axis perpendicular to the middle plane of the substrate 4, itself parallel to the rear face 430. It may thereby be displaced between a position illustrated in FIG. 7D, in which it is at most moved away from the substrate 4 to be routed, and a position illustrated in FIGS. 7B and 7C, in which it is brought closer to this substrate 4.

The gases used for forming a plasma are introduced into the inside of the enclosure 50 via ducts, for example, here two in number, referenced as 55 and 56.

The volatile materials, produced during the reaction that occurs in the inside of the enclosure 50, may be discharged out of the latter by suction means and through an orifice not shown in the figures.

Voltage is applied to the electrodes 51 and 52, which has the effect of generating an electric field inside the enclosure 50 and of transforming the gases introduced into the ducts 55 and 56 into plasma.

Different parameters, such as the temperature and pressure prevailing inside the enclosure 50, the nature, the flow rate and the ratios of the gases introduced into the inside of the enclosure 50, the frequency of the plasma, as well as the power applied on the terminals of the electrodes 51 and 52, have an incidence on the chemical composition of the formed plasma and on its nature, i.e., a deposition plasma or an etching plasma. These parameters will be detailed hereafter.

Preferably, the plasma formed, both for deposition and for etching, is isotropic. This means that the action of the plasma is preferably achieved via radicals created in the plasma and, optionally, may be carried out via ions accelerated in the sheath of the plasma.

The fact that the rear face 430 of the substrate 4 is in contact with the lower electrode 52 and with the lower insulator 54, allows an exclusion area to be defined on the rear face, referenced as 540, inaccessible to the plasma since it is masked.

As this may be seen in the figures, the outer diameter of the insulator 54 exactly corresponds to the diameter of the exclusion area on the rear face 540 (see FIG. 7A) since the substrate 4 to be routed is directly in contact with the insulator 54.

Further, the substrate 4 to be routed is, of course, positioned so as to be centered relatively to the annular insulator 54.

Moreover, the upper insulator 53 also allows definition on the front face 411 of the substrate 4, of a so-called "front face exclusion" area 530, inaccessible to the plasma.

The diameter of the front face exclusion area 530 not only depends on the diameter of the upper insulator 53, but also on its distance from the substrate 4 to be routed. Thus, the more the insulator 53 is moved away from the front face 411 of the substrate, the smaller the diameter is of the front face exclusion area 530 (see FIG. 7A), and conversely, the more it moves closer, the larger the diameter is of the area 530 (see FIG. 7B).

The annular peripheral area of substrate 4 that remains accessible to the plasma, i.e., the area that extends out of the aforementioned areas 530 and 540, is referenced as 500.

The different steps of the routing method will now be described.

After the substrate 4 to be routed has been introduced into the enclosure 50, so that its rear face 430 rests against the insulating element 54 and the lower electrode 52, the parameters for forming the plasma are adjusted so as to deposit on the accessible annular area 500, a layer of a protective material 6.

Preferably, this protective material 6 is a polymer.

Still preferably, this is a polymer of the polyethylene type, obtained with a plasma formed from ethylene $C_2H_4$.

The upper insulator 53 is then brought closer to the front face 411 of the substrate 4, so as to enlarge the front face exclusion area 530 and to increase the diameter thereof. It will be noted that the insulator 53 is never brought into contact with the upper face 411 of the substrate 4, so as to avoid damaging or contaminating the latter.

In this position, illustrated in FIG. 7B, the parameters of the plasma are adapted so as to achieve partial etching of the protective material 6. This etching is partial, so that it gives the possibility of only keeping a ring 60 of protective material on the front face 411 of the substrate 4.

This partial etching is possible because of the enlargement of the front face exclusion area 530. In the position of the insulator 53 illustrated in FIG. 7A, the area where the ring 60 is found is accessible by the plasma and the protective material 6 was able to be deposited therein. On the other hand, when the insulator 53 is lowered, the portion of the protective material 6 corresponding to the ring 60 is no longer accessible by the plasma and is not, therefore, etched by the latter. In other words, when the surface area of the front face exclusion area 530 increases, the latter of the accessible area 500 decreases. The reduced accessible area bears reference 500'.

The nature of the plasma for etching the protective material 6 is, of course, dependent on the chemical nature of this material.

As an example, for a protective material in polyethylene, etching is carried out with a plasma based on oxygen ($O_2$).

Figure 7C:
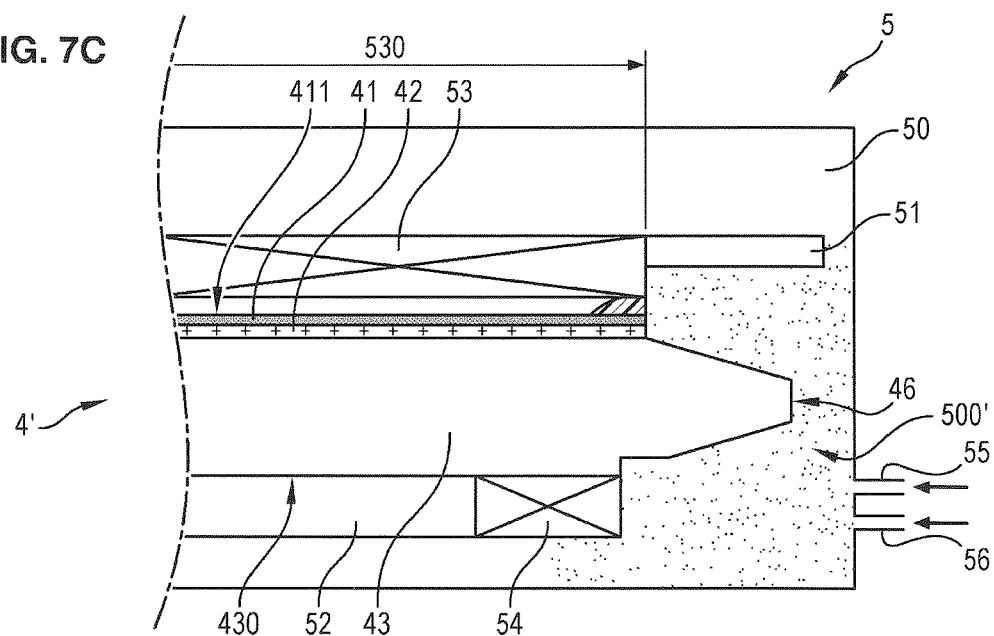

The following step is illustrated in FIG. 7C. While maintaining the upper insulator 53 in the position illustrated in FIG. 7B, the nature of the gases introduced into the inside of enclosure 50 is changed so as to generate a plasma capable of etching the material of the surface layer 41 at the peripheral annular reduced accessible area 500' plasma. The parameters are then modified for etching the insulator layer 42.

As an example, when the material forming the surface layer 41 is silicon, the etching plasma is a mixture of argon and $SF_6$ (sulfur hexafluoride) and optionally nitrogen and when the material forming the insulator 42 is oxide, the etching plasma is then a mixture of nitrogen and $CHF_3$ (trifluoromethane) or further a mixture of oxygen ($O_2$) and of tetrafluoromethane ($CF_4$).

As illustrated in FIG. 7C, a routed substrate 4' is obtained at its periphery, not only on its front face and rear face, but also on its side.

If necessary, routing may be continued in order to etch a portion of the support 43 over a depth P.

Figure 7D:
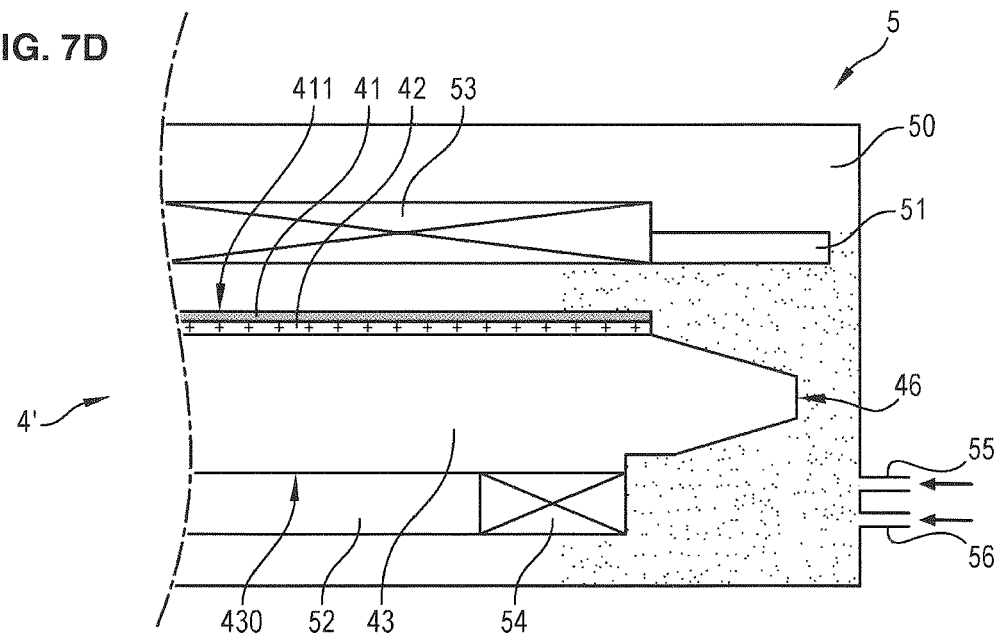

Finally, as illustrated in FIG. 7D, the upper insulator is then moved away from the front face 41 of the substrate 4' and the parameters of the plasma are modified so as to generate an etching plasma allowing removal of the ring 60 of protective material. This etching plasma is generally the same as the one used in the etching step illustrated in FIG. 7B.

For all the steps that have just been described and that relate to the use of a deposition plasma or an etching plasma, the conventional frequency of the plasma is 13.56 MHz. The power is of the order of 100 W to 500 W. The duration of application of the plasma varies between 5 seconds and 40 seconds. The combination of the power and of the duration of the plasma notably induces an effect on the etched thickness. Finally, the pressure inside the enclosure is of the order of a few torrs (1 torr being equal to about $10^2$ Pa or more precisely 133 Pa).

Encapsulation

The encapsulation may be achieved with a rapid thermal annealing treatment known under the acronym of "RTA" (Rapid Thermal Annealing), which may advantageously be preceded by a cleaning step.

Typically, this may be a standard cleaning such as a sequence: ozone ($O_3$)/RCA, the latter treatment consisting of treating the surfaces successively with:

a first bath of a solution known under the acronym of "SC1" ("Standard Clean 1," which means a "standard cleaning solution 1"), and which comprises a mixture of ammonium hydroxide (NH₄OH), hydrogen peroxide (H₂O₂) and deionized water; and a second bath of a solution known under the acronym of "SC2" ("Standard Clean 2," which means a "standard cleaning solution 2"), and which comprises a mixture of hydrochloric acid (HCl), hydrogen peroxide (H₂O₂) and deionized water.

The RTA treatment is carried out at a high temperature for a short period.

Preferably, this heat treatment is carried out at a temperature comprised between about 1,150° C. and 1,300° C., still preferably at about 1,200° C. This treatment is conducted for a duration of 15 seconds to 5 minutes, preferably for less than 3 minutes. The RTA is preferably achieved in a hydrogen and/or argon atmosphere.

The encapsulation treatment may also be carried out by epitaxy.

The encapsulation may be achieved by an RTA treatment followed by epitaxy or vice versa, these steps being achieved under the same conditions as those described earlier.

The encapsulation may also be achieved with laser annealing ("laser anneal"). This annealing may optionally be local and limited to the edge of the routed film comprising the surface layer 41 and the insulator 42.

The method according to the invention, therefore, has many advantages. With it, it is possible to obtain a peripheral crown width L1 around the encapsulated portion, not only regularly all around the SeOI substrate, but also in a reproducible way from one substrate to the other (see FIG. 6C).

The method according to the invention further allows a substantial reduction in the overall defectivity of the substrates made. Indeed, the routing step not only allows removal of the flakes 44 and of the jagged edges 45 (See FIG. 6A), but also of a large proportion of the particles present at the edge and, which, in the absence of such a step, would be capable of being deposited on the surface layer 41 of the SeOI during the cleaning step preceding the RTA treatment. Without this routing step, such semiconducting material particles may be displaced from the periphery toward the center of the substrate and be definitively sealed on this substrate during the RTA treatment.

Finally, the invention finds a particular application in finishing treatments including sacrificial oxidation and deoxidation steps.

Two exemplary methods will be mentioned including the finishing steps according to the invention.

A first method comprises the following steps:
detachment in order to carry out transfer of layer(s) and obtaining the SOI substrate,
routing followed by an encapsulation treatment according to the method of the invention,
first sacrifiial oxidation, followed by a first deoxidation,
RTA treatment,
optionally, a second sacrificial oxidation step followed by a second deoxidation step.

A second method is the following:
detachment for carrying out transfer of layer(s) and obtaining the SOI substrate,
RTA treatment,
a first sacrificial oxidation, followed by a first deoxidation,
routing followed by encapsulation treatment according to the method of the invention,
optionally, a second sacrificial oxidation step followed by a second deoxidation step.

Both of these methods are particularly used for providing substrates intended for partially or fully depleted SOI applications.

The invention claimed is:

1. A method for forming a semiconductor-on-insulator (SeOI) type substrate including an insulator layer buried between a layer of semiconducting material and a support, the method comprising:
   routing an annular periphery of the SeOI type substrate by removing a portion of the layer of semiconducting material and a portion of the insulator layer at the annular periphery of the SeOI type substrate to form a routed SeOI type substrate; and
   encapsulating the routed SeOI type substrate by covering a side edge of the buried insulator layer with semiconducting material.

2. The method of claim 1, further comprising encapsulating the routed SeOI type substrate immediately after routing the annular periphery of the SeOI type substrate.

3. The method of claim 1, wherein removing the portion of the layer of semiconducting material and the portion of the insulator layer at the annular periphery of the SeOI type substrate comprises grinding an annular peripheral edge of the SeOI type substrate.

4. The method of claim 1, wherein removing the portion of the layer of semiconducting material and the portion of the insulator layer at the annular periphery of the SeOI type substrate comprises etching an annular peripheral edge of the SeOI type substrate.

5. The method of claim 1, wherein encapsulating the routed SeOI type substrate comprises subjecting the routed SeOI type substrate to a rapid thermal annealing (RTA) treatment.

6. The method of claim 5, wherein subjecting the routed SeOI type substrate to a RTA treatment comprises subjecting the routed SeOI type substrate to a temperature between 1,150° C. and 1,300° C. for a duration of between 15 seconds and about 5 minutes.

7. The method of claim 5, further comprising subjecting the routed SeOI type substrate to the RTA treatment under an atmosphere comprising one of hydrogen, argon, and a mixture of hydrogen and argon.

8. The method of claim 1, wherein encapsulating the routed SeOI type substrate comprises subjecting the routed SeOI type substrate to epitaxy.

9. The method of claim 1, wherein encapsulating the routed SeOI type substrate comprises subjecting the routed SeOI type substrate to a rapid thermal annealing (RTA) treatment and to epitaxy.

10. The method of claim 1, wherein encapsulating the routed SeOI type substrate comprises annealing at least a portion of the routed SeOI type substrate with a laser.

11. The method of claim 1, wherein routing the annular periphery of the SeOI type substrate comprises:
   depositing a layer of protective material on a peripheral annular area of the SeOI type substrate using a plasma;
   etching and removing a portion of the protective material using a plasma and leaving a ring of the protective material on a front face of the SeOI type substrate, the ring located a distance from a side edge of the SeOI type substrate and delimiting a reduced peripheral annular area of the SeOI type substrate accessible to a plasma;
   etching and removing at least a portion of the SeOI type substrate at the reduced peripheral annular area of the SeOI type substrate using an etching plasma; and
   removing the ring of the protective material using a plasma.

12. The method of claim 11, further comprising routing the annular periphery of the SeOI type substrate in an enclosure.

13. The method of claim 12, wherein the enclosure further includes a circular lower electrode surrounded by an annular lower insulating element and a disk-shaped upper insulating element surrounded by a ring-shaped upper electrode, the method further including:

introducing the SeOI type substrate into the enclosure and positioning a rear face of the SeOI type substrate in contact with the circular lower electrode and the lower insulating element so as to define a lower exclusion area on the rear face inaccessible to plasma generated within the enclosure, positioning the disk-shaped upper insulating element a first distance from the front face of the SeOI type substrate so as to define an upper exclusion area on the front face also inaccessible to plasma generated within the enclosure, the outer diameters of both the lower exclusion area and the upper exclusion area being less than the diameter of the SeOI type substrate, a portion of the front face outside the upper exclusion area and a portion of the rear face outside the lower exclusion area of the SeOI type substrate forming the peripheral annular area of the SeOI type substrate, the peripheral annular area being accessible to plasma generated within the enclosure; and depositing the layer of protective material on the peripheral annular area of the SeOI type substrate using a plasma while the disk-shaped upper insulating element is positioned at the first distance from the front face of the SeOI type substrate;

moving the disk-shaped upper insulating element closer to the front face of the SeOI type substrate and positioning the disk-shaped upper insulating element a second distance from the front face of the SeOI type substrate so as to enlarge the upper exclusion area on the front face and etching and removing the portion of the protective material while the disk-shaped upper insulating element is positioned at the second distance from the front face of the SeOI type substrate; and moving the disk-shaped upper insulating element away from the front face of the SeOI type substrate and removing the ring of protective material after etching and removing the at least a portion of the SeOI type substrate at the reduced peripheral annular area of the SeOI type substrate.

14. The method of claim 1, further comprising performing a sacrificial oxidation process followed by a deoxidation process on the SeOI type substrate after routing the annular periphery of the SeOI type substrate and encapsulating the routed SeOI type substrate.

15. The method of claim 14, further comprising subjecting the SeOI type substrate to a rapid thermal annealing (RTA) treatment after performing the sacrificial oxidation process and the deoxidation process on the SeOI type substrate.

16. The method of claim 14, further comprising performing a second sacrificial oxidation process followed by a second deoxidation process on the SeOI type substrate after subjecting the SeOI type substrate to the RTA treatment.

17. The method of claim 1, further comprising, prior to routing the annular periphery of the SeOI type substrate and encapsulating the routed SeOI type substrate, subjecting the SeOI type substrate to a rapid thermal annealing (RTA) treatment, followed by a sacrificial oxidation process and a subsequent deoxidation process.

18. A method for forming a semiconductor-on-insulator (SeOI) type substrate including an insulator layer buried between a layer of semiconducting material and a support, the method comprising:

introducing the SeOI type substrate into the enclosure including a circular lower electrode surrounded by an annular lower insulating element and a disk-shaped upper insulating element surrounded by a ring-shaped upper electrode;

positioning a rear face of the SeOI type substrate on the circular lower electrode and the lower insulating element;

positioning the disk-shaped upper insulating element a distance from the front face of the SeOI type substrate;

depositing a protective material on a peripheral annular area of the SeOI type substrate using plasma generated with the circular lower electrode and the ring-shaped upper electrode while the disk-shaped upper insulating element is positioned at the first distance from the front face of the SeOI type substrate;

moving the disk-shaped upper insulating element closer to the front face of the SeOI type substrate and removing a portion of the protective material using plasma generated with the circular lower electrode and the ring-shaped upper electrode;

removing a portion of the layer of semiconducting material and a portion of the insulator layer at the annular periphery of the SeOI type substrate laterally beyond a remaining ring of the protective material using plasma generated with the circular lower electrode and the ring-shaped upper electrode; and removing the remaining ring of protective material after removing the portion of the layer of semiconducting material and the portion of the insulator layer at the annular periphery of the SeOI type substrate.

19. The method of claim 18, wherein removing the remaining ring of protective material comprises removing the remaining ring of protective material using plasma generated with the circular lower electrode and the ring-shaped upper electrode.

20. The method of claim 18, further comprising covering a side edge of the buried insulator layer with semiconducting material such that the buried insulator layer is encapsulated after removing the remaining ring of protective material.

\* \* \* \* \*